(12) United States Patent
Puligadda et al.

(10) Patent No.: US 6,670,425 B2
(45) Date of Patent: Dec. 30, 2003

(54) ANTI-REFLECTIVE COATING OF POLYMER WITH EPOXIDE RINGS REACTED WITH LIGHT ATTENUATING COMPOUND AND UNREACTED EPOXIDE RINGS

(75) Inventors: Rama Puligadda, Rolla, MO (US); James E. Lamb, III, Rolla, MO (US); Tony D. Flaim, St. James, MO (US); Runhui Huang, Rolla, MO (US); Xie Shao, Rolla, MO (US)

(73) Assignee: Brewer Science, Inc., Rolla, MO (US)

( * ) Notice: Subject to any disclaimer, the term of this patent is extended or adjusted under 35 U.S.C. 154(b) by 21 days.

(21) Appl. No.: 09/874,783

(22) Filed: Jun. 5, 2001

(65) Prior Publication Data

US 2003/0004283 A1 Jan. 2, 2003

(51) Int. Cl.[7] .................. B32B 27/06; B32B 27/38; C08G 59/14; C08G 59/16; C08F 20/32
(52) U.S. Cl. ................ 525/327.3; 427/386; 428/413; 428/417; 525/524; 525/525; 525/526; 525/523; 525/533
(58) Field of Search ............... 525/327.3, 524, 525/525, 526, 523, 533; 428/413, 417; 427/386

(56) References Cited

U.S. PATENT DOCUMENTS

| | | | | |
|---|---|---|---|---|
| 5,597,868 A | | 1/1997 | Kunz | 525/154 |
| 5,919,598 A | * | 7/1999 | Flaim et al. | 430/271.1 |
| 6,103,456 A | | 8/2000 | Többen et al. | 430/317 |
| 6,306,459 B1 | * | 10/2001 | Fleming | 427/163.4 |
| 6,309,790 B1 | | 10/2001 | Jung et al. | 430/270.1 |
| 6,388,039 B1 | | 5/2002 | Jung et al. | 526/329.6 |
| 2002/0136834 A1 | | 9/2002 | Jung et al. | 427/372.2 |

FOREIGN PATENT DOCUMENTS

| | | | |
|---|---|---|---|
| EP | 851300 A1 | * | 7/1998 |
| JP | 5-283560 A | * | 10/1993 |
| SU | 1682362 A1 | * | 10/1991 |
| WO | WO 01/15211 A1 | * | 3/2001 |

OTHER PUBLICATIONS

Kal'yan et al., Chemical abstracts accession No. 1973:480423, Tr., Kishinev. Politekh. Inst.. (1971), No. 24, pp. 97–104.*

Certified English translation of article: Moldovan SSR Ministry of Public Education—Sergey Lazo Chisinau Polytechnic Institute; Working Papers of the School of Technology, Chemistry and Chemical Engineering, No. 24; and corresponding Russian article—1971.

* cited by examiner

*Primary Examiner*—Robert E. L. Sellers
(74) *Attorney, Agent, or Firm*—Hovey Williams LLP

(57) ABSTRACT

Anti-reflective compositions and methods of using those compositions with low dielectric constant materials are provided. In one embodiment, the compositions include polymers comprising recurring monomers having unreacted epoxide groups. In another embodiment, the polymers further comprise recurring monomers comprising epoxide rings reacted with a light attenuating compound so as to open the ring. The compositions can be applied to dielectric layers so as to minimize or prevent reflection during the dual damascene process while simultaneously blocking via or photoresist poisoning which commonly occurs when organic anti-reflective coatings are applied to low dielectric constant layers.

5 Claims, 2 Drawing Sheets

ANTI-REFLECTIVE COATING OF POLYMER WITH EPOXIDE RINGS REACTED WITH LIGHT ATTENUATING COMPOUND AND UNREACTED EPOXIDE RINGS

BACKGROUND OF THE INVENTION

1. Field of the Invention

The present invention is concerned with anti-reflective coatings including polymers comprising unreacted epoxide groups, and methods of using those coatings with low dielectric constant materials to inhibit or avoid via or photoresist poisoning normally associated with those materials.

2. Description of the Prior Art

The integrated circuit industry is continually moving towards denser device integration and faster device switching speeds. Through advanced semi-conductor processing techniques, integrated circuit devices with submicron feature sizes (i.e., less than 0.35 $\mu$m) can now be manufactured. This trend towards reduced feature size has, in turn, driven the need for multilayer interconnects.

The dual damascene process is a multi-level interconnection process in which, in addition to forming the grooves of the single damascene process, conductive contact or via holes are formed as well. In this scheme, circuit performance increasingly becomes a function of delay time of electronic signals traveling between the millions of gates and transistors present on an integrated circuit chip. Until recently, the integrated circuit R-C delay that determines device switching speeds was dominated by the CMOS transistor drive capacitance and load resistance. For submicron devices, the increase in signal delay due to capacitance of multilayer devices has become a limitation to improving device performance. To meet the speed and decreased crosstalk requirements for multilayer interconnect devices, it is desirable to use insulating materials having low dielectric constants (i.e., less than about 3.8) between metal interconnection lines. Some materials which have dielectric constants lower than 3.8 are disclosed in U.S. Pat. No. 6,054,380, incorporated by reference herein.

While use of these dielectric materials has been considered, they have not yet been incorporated into integrating circuit production lines. One of the primary technical difficulties preventing the use of these materials is a problem known as via poisoning or photoresist poisoning (see e.g., U.S. Pat. No. 6,103,456, incorporated by reference herein). A typical dual damascene process involves optical lithography techniques. In processes using a low dielectric constant material, the process would involve successively applying a barrier layer, a low dielectric constant layer, a hard mask layer, and an anti-reflective layer on a semiconductor substrate. Thereafter, the anti-reflective layer and low dielectric constant layer (also referred to as the low k dielectric layer) are patterned by photolithography with a photoresist layer to create openings or trenches. However, via or photoresist poisoning which occurs as a result of the low k dielectric material lying beneath the organic anti-reflective material has hindered the removal of the photoresist from the openings in the anti-reflective material. As this opening is critical to the subsequent steps of forming multilayer interconnects, the inability to clear the photoresist interferes with quality device fabrication.

SUMMARY OF THE INVENTION

The present invention overcomes the problems associated with via or photoresist poisoning by providing anti-reflective coating compositions which inhibit and/or block this poisoning.

In more detail, the compositions comprise light attenuating compounds or chromophores which can be physically mixed in the composition, reacted with some of the epoxide rings present in the polymer(s) of the composition, and/or otherwise bonded with some or all of the polymers present in the composition, so long as the compositions comprise unreacted or intact epoxide rings in the quantities recited below.

In one preferred embodiment, the compositions include a polymer which comprises: recurring monomers comprising an epoxide ring reacted with a light attenuating compound so as to open the epoxide ring (e.g., one of the carbon atoms of the ring has bonded with an atom of the light attenuating compound); and recurring monomers comprising unreacted epoxide rings (i.e., closed or intact epoxide rings). In another embodiment, the opened and intact epoxide rings are present on in different polymers.

Regardless of the embodiment, the molar ratio of unreacted epoxide rings present in the composition to reacted epoxide rings present in the composition is preferably from about 10:90 to about 90:10, more preferably from about 20:80 to about 80:20, and even more preferably from about 20:80 to about 50:50. These ratios are essentially the same in the cured composition as well. The average molecular weight of the polymer(s) is generally from about 1,000–15,000 Daltons, and more preferably from about 3,000–5,000 Daltons.

In a particularly preferred embodiment, the polymer comprises recurring monomers selected from the group consisting of:

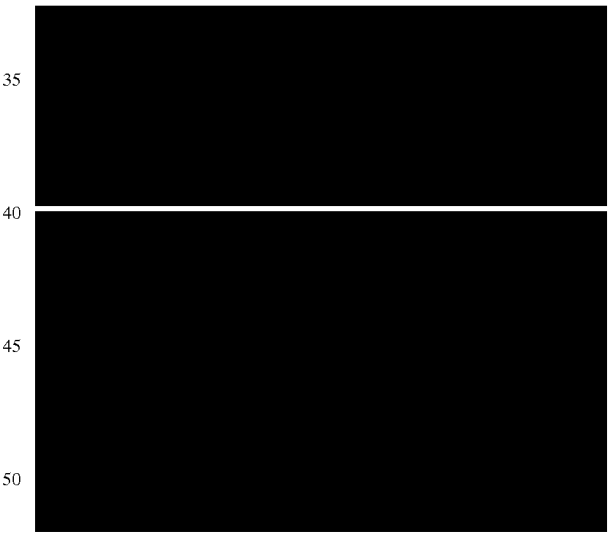

wherein R comprises a light attenuating compound.

Preferred light attenuating compounds comprise a moiety selected from the group consisting of carboxylic acids, phenols, and amines, with a particularly preferred light attenuating compound being 9-anthracene carboxylic acid.

The polymers are preferably prepared by partially grafting an epoxy resin (or other polymer in applications where the light attenuating compound is not bonded with the epoxide moieties) with the light attenuating compound. One skilled in the art will appreciate that any known grafting process is suitable, so long as it achieves the desired epoxide ring levels as described above. The resulting polymers can then be used to prepare the anti-reflective compositions by dissolving or dispersing the polymers in a suitable solvent system. In applications where part or all of the light attenuating compound is physically mixed with the polymer(s), the light attenuating compound is also dissolved or dispersed in the solvent system.

The solvent system should have a boiling point of from about 100–180° C., and preferably from about 120–150° C. The amount of polymer dissolved in the solvent system is preferably from about 2–15% by weight polymer, and more preferably from about 3–7% by weight polymer, based upon the total weight of the composition taken as 100% by weight. The solvent system should be utilized at a level of from about 85–98% by weight, and more preferably from about 93–97% by weight, based upon the total weight of the composition taken as 100% by weight. Preferred solvent systems include a solvent selected from the group consisting of ethylene glycol monomethyl ether, ethylene glycol monoethyl ether, propylene glycol monomethyl ether, propylene glycol monomethyl ether acetate (PGMEA), ethyl lactate, propylene glycol n-propyl ether, and mixtures thereof.

The inventive compositions can further include a crosslinking agent. This can be accomplished by the use of a crosslinking agent separate from the polymer or, alternatively, the polymer can include "built-in" crosslinking moieties. Preferred crosslinking agents include those selected from the group consisting of melamine and glycouril crosslinking agents. The crosslinking agent or moieties should be present in the composition at a level of from about 0.2–5% by weight, and preferably from about 0.5–1% by weight, based upon the total weight of all ingredients in the composition taken as 100% by weight. Thus, the anti-reflective compositions should cross-link at a temperature of from about 85–250° C., and more preferably from about 100–220° C.

It will be appreciated that numerous other optional compounds can be incorporated into the inventive anti-reflective or fill compositions if desired. Such other optional ingredients include 4,4'-sulfonyl diphonol and pyridinium tosylate.

The anti-reflective coatings are applied according to conventional processes (e.g., spincoating), and can be used in conjunction with any low k (less than about 3.8) dielectric material including fluorinated silicate glass, amorphous-fluorinated carbon, fluorinated polyimides, fluorinated polyarylene ethers, and parylene-F.

DETAILED DESCRIPTION OF THE PREFERRED EMBODIMENTS

EXAMPLES

Figure 1:
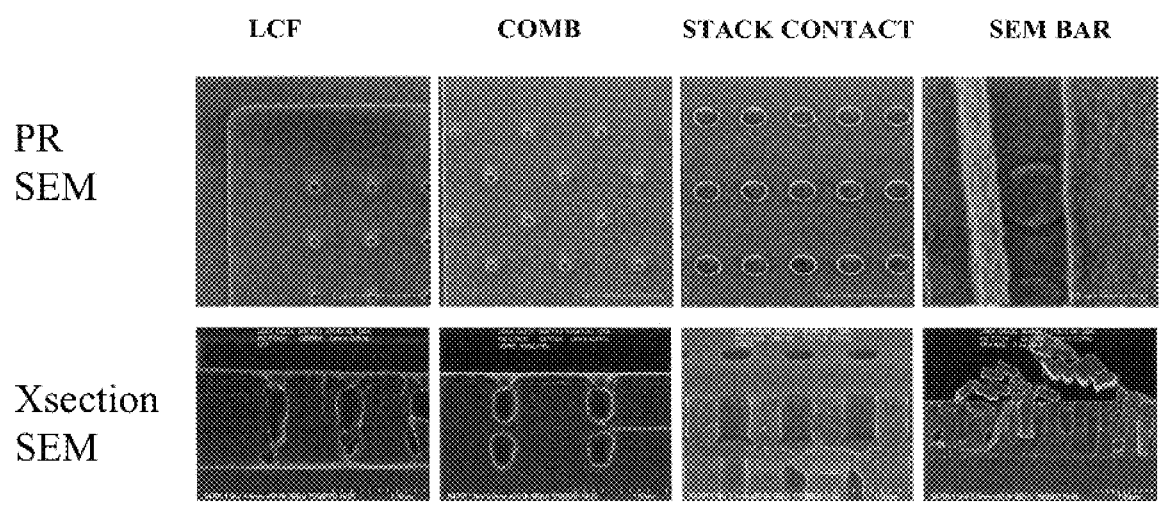
FIG. 1 is an SEM photograph (40×) depicting the photoresist layers of control wafers including anti-reflective coatings according to the prior art.

The following examples set forth preferred methods in accordance with the invention. It is to be understood, however, that these examples are provided by way of illustration and nothing therein should be taken as a limitation upon the overall scope of the invention.

Example 1
1. Grafting of the Polymer with 9-Anthranoic Acid
In this procedure, 10 g of an alicyclic solid epoxy resin (available under the trade name EHPE from Daicel Chemical Industries, Ltd.), 5.45 g of 9-anthracene carboxylic acid, and 0.315 g of benzyltriethylammonium chloride (BTAC) were dissolved in 63 g of propylene glycol monomethyl ether (PGME) followed by refluxing at 120° C. for 24 hours. The reaction mixture was then allowed to cool.

Scheme A depicts the reaction which occurred during this part of the example.

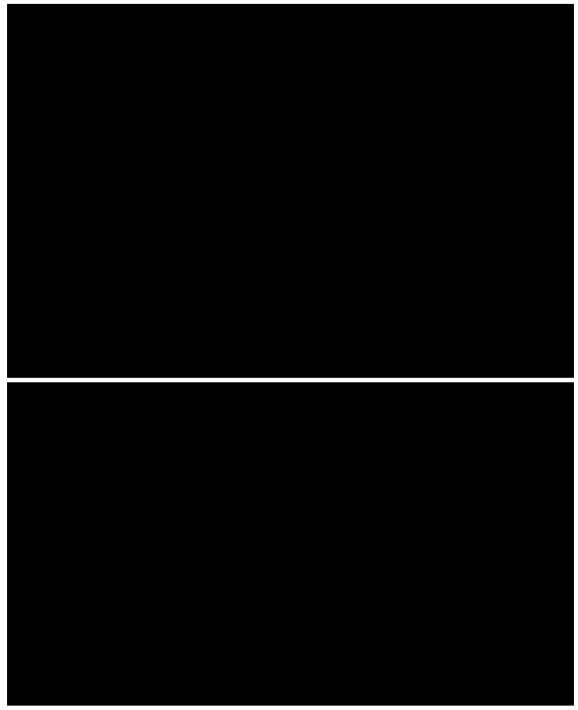

2. Formulation of the Anti-Reflective Coating
Next, 56.54 g of the intermediate prepared in part 1 of this example was added to 212.30 g of propylene glycol monomethyl ether acetate (PGMEA), 130.46 g of PGME, 2.58 g of Cymel® (an aminoplast, obtained from Cytec Industries, Inc.), and 0.45 g of pyridinium p-toluene sulfonate. The ingredients were mixed until all solids had dissolved after which 40 g of ion exchange beads (650 C) were added followed by mixing for four hours. The beads were filtered through a screen, and the formulation was then filtered through a 0.1 $\mu$m end point filter under nitrogen pressure. The formulation was spin-coated onto a silicon wafer at 2500 rpm for 60 seconds followed by baking on a hotplate at 205° C. for 60 seconds. The cured film had a thickness of 720 Å and an optical density of 10.35/$\mu$m.

Example 2
1. Preparation of the Copolymer
In this procedure, 12.39 g of glycidyl methacrylate, 23.01 g of hydroxypropyl methacrylate, 3.54 g of dodecanethiol, and 1.06 g of azobisisobutyronitrile were dissolved in 160.0 g of PGME. The reaction mixture was heated to 100° C. with constant stirring and under a nitrogen atmosphere. The reaction conditions were maintained for 24 hours to obtain a 20 weight % solution of the copolymer in PGME.
2. Grafting of the Copolymer with 9-Anthranoic Acid
Next, 65.0 g of the copolymer solution prepared in part 1 of this example was mixed with 0.175 g of 9-anthracene carboxylic acid, 0.175 g of BTAC, and 27.25 g of PGME. The reaction mixture was heated with constant stirring to reflux temperature under a nitrogen atmosphere, with these reaction conditions being maintained for 24 hours. Upon GPC analysis, the prepared solution was found to contain 16% unreacted 9-anthracene carboxylic acid.

The reactions carried out in parts 1 and 2 of this example are shown in Scheme B below.

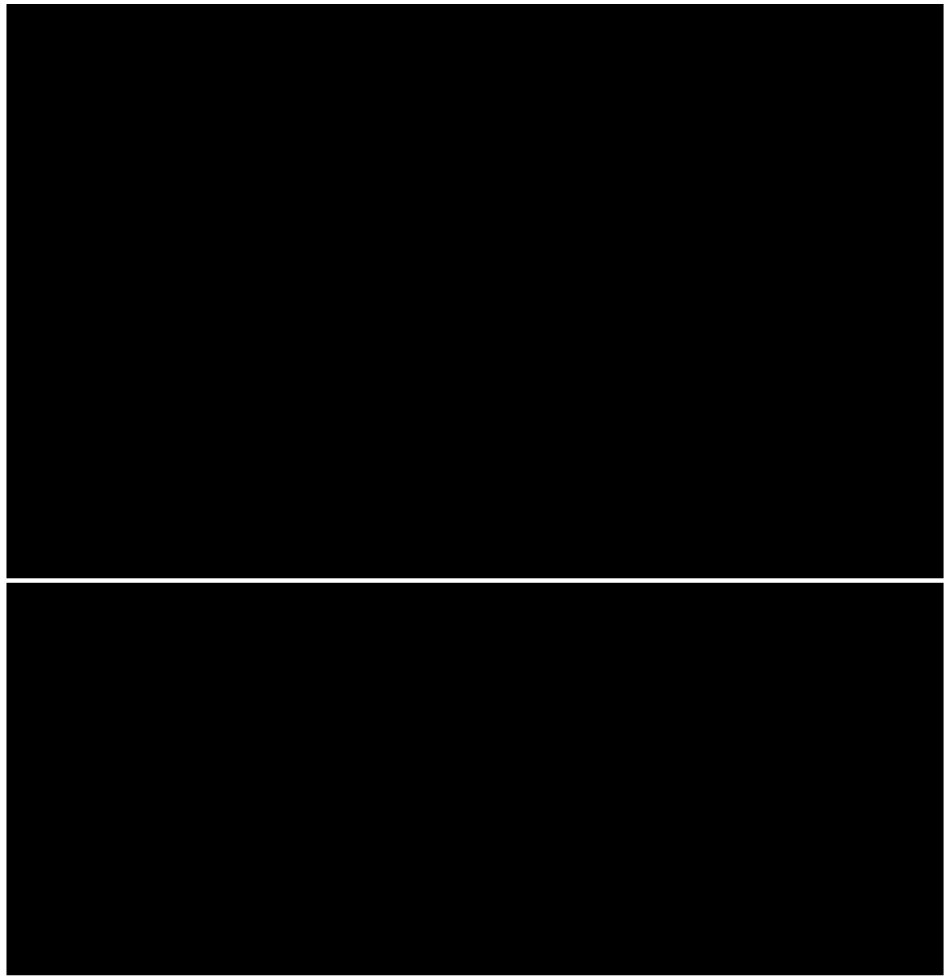

3. Formulation of the Anti-Reflective Coating

An anti-reflective coating was prepared by mixing 12.0 g of the grafted polymer solution prepared in part 2 of this example with 17.9 g of PGMEA, 32.14 g of PGME, 0.58 g of Cymel 303® (crosslinking material available from Cytec Industries, Inc.), 0.0116 g of p-toluenesulfonic acid, and 0.143 g of 4,4'-sulfonyl diphenol. The ingredients were mixed until all of the solids were dissolved, followed by filtering of the mixture through a 0.1 µm filter.

The filtered formulation was then spin-coated onto a silicon wafer at 2500 rpm for 60 seconds followed by baking on a hotplate at 205° C. for 60 seconds. The cured film had a thickness of 195 Å and an optical density of 9.10 µm.

Example 3

The anti-reflective composition prepared in Example 1 above was tested on wafers containing LCF pattern (refers to a pattern printed in reverse tone on the wafer scribbling), combination (trench and space pattern with vias under the trenches), stacked contact, and SEM bar features. An organosilicate dielectric material was applied to the wafers. Next, the anti-reflective composition was coated onto the resulting low k dielectric layer (with vias patterned in it) by spincoating the anti-reflective composition at 500 rpm for 60 seconds followed by a 500 rpm final spin out and baking at 185° C. for 90 seconds. A photoresist composition (PEK-131, obtained from Sumitomo Chemical) was applied to the cured anti-reflective layer by spincoating of at 4,000 rpm for 60 seconds followed by baking at 90° C. for 60 seconds.

A second group of wafers was prepared by the same preparation procedure as described above except that these wafers were also subjected to a 440° C. passivation bake for 90 seconds prior to the application of the anti-reflective coating. Also, a control set of wafers using a prior art anti-reflective coating (RH2213-22-5 for conventional 248 nm BARC applications, Brewer Science, Inc.) was also tested.

All wafers were coated and developed on a DNS 80B. Exposures were carried out with a Nikon S201 Scanner at exposure energies of 32 mJ. The photoresist was then baked at 90° C. for 90 seconds and developed with CD26 developer (obtained from Shipley Company).

Figure 2:
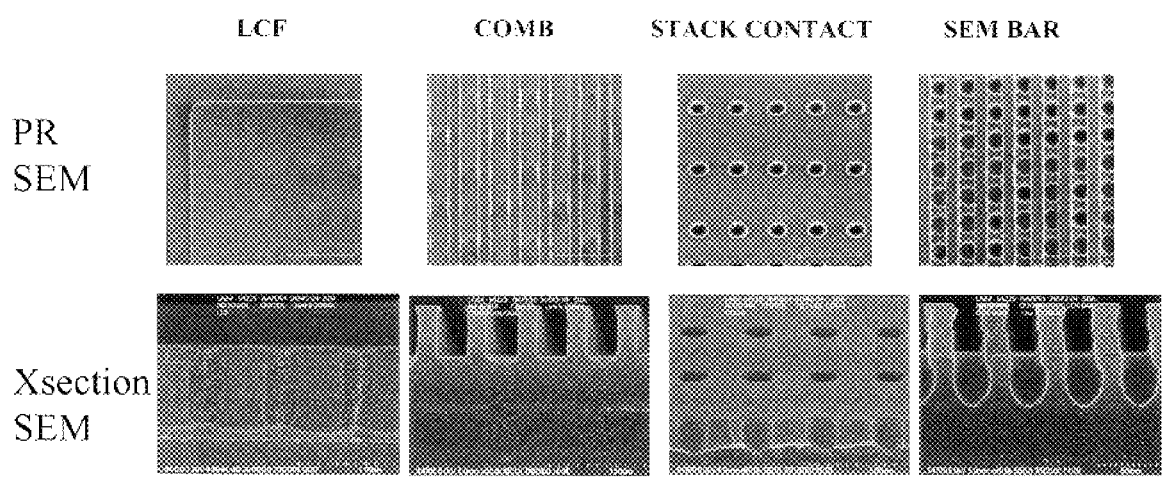
FIG. 2 is an SEM photograph (40×) depicting the photoresist layers of test wafers including anti-reflective coatings according to the invention.

FIG. 1 (PR: 0.53 µm PEK 131, exposure 32 mJ, focus −0.1 µm; antireflective coating: 1582 Å, 185° C. curing) depicts SEM photographs of the photoresist layer after exposure of test samples utilizing an anti-reflective coating according to the invention. FIG. 2 (PR: 0.53 µm PEK 131, exposure 32 mJ, focus −0.1 µm; antireflective coating: 1638

Å, 185° C. curing) shows the SEM photographs of the photoresist layer of the control sample. A comparison of the photographs shows that using an anti-reflective coating according to the invention blocked the via poisoning, thus allowing for the substantially complete removal of the photoresist material from the holes and trenches (see FIG. 1) unlike the control samples (see FIG. 2) which had photoresist material remaining in the holes and trenches.

We claim:

1. In a cured protective layer capable of blocking or inhibiting via poisoning, said layer being formed from a composition comprising at least one polymer, the improvement which comprises said cured layer including:
    (a) a first set of recurring monomers each individually comprising an epoxide ring reacted with a light attenuating compound so as to open the epoxide ring; and
    (b) a second set of recurring monomers each individually comprising unreacted epoxide rings, the molar ratio of unreacted epoxide rings to reacted epoxide rings being from about 10:90 to about 90:10.

2. The layer of claim 1, wherein said first and second sets of recurring monomers are present in the same polymer.

3. The layer of claim 1, wherein said light attenuating compound comprises a moiety selected from the group consisting of carboxylic acids, phenols, and amines.

4. The layer of claim 3, said light attenuating compound being 9-anthracene carboxylic acid.

5. The layer of claim 1, wherein said cured layer comprises recurring monomers selected from the group consisting of:

wherein R comprises a light attenuating compound.

* * * * *

UNITED STATES PATENT AND TRADEMARK OFFICE
CERTIFICATE OF CORRECTION

PATENT NO.     : 6,670,425 B2                                      Page 1 of 2
DATED          : December 30, 2004
INVENTOR(S)    : Pugligadda et al.

It is certified that error appears in the above-identified patent and that said Letters Patent is hereby corrected as shown below:

Column 2,
Lines 32-52, should be replace with the following chemical structure:

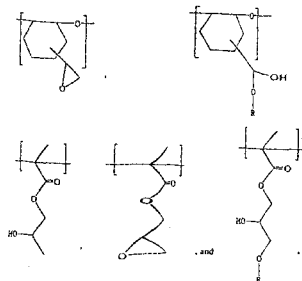

Column 4,
Lines 8-35, should be replaced with the following chemical structure:

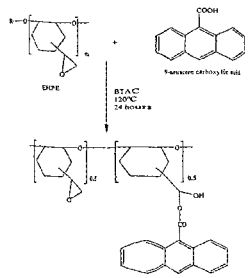

Columns 5 and 6,
Lines 5-45, should be replaced with the following chemical structure:

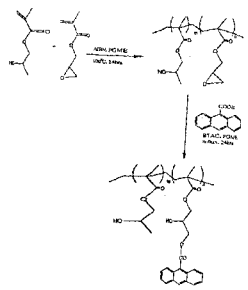

UNITED STATES PATENT AND TRADEMARK OFFICE
CERTIFICATE OF CORRECTION

PATENT NO. : 6,670,425 B2
DATED : December 30, 2004
INVENTOR(S) : Pugligadda et al.

It is certified that error appears in the above-identified patent and that said Letters Patent is hereby corrected as shown below:

Column 8,
Lines 5-25, should be replaced with the following chemical structure:

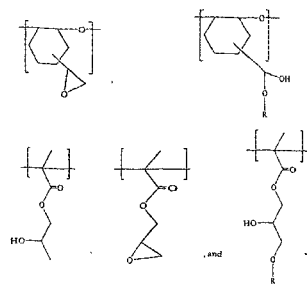

Signed and Sealed this

Twenty-fourth Day of August, 2004

JON W. DUDAS
*Director of the United States Patent and Trademark Office*

UNITED STATES PATENT AND TRADEMARK OFFICE
CERTIFICATE OF CORRECTION

PATENT NO. : 6,670,425 B2
DATED : December 30, 2003
INVENTOR(S) : Puligadda et al.

It is certified that error appears in the above-identified patent and that said Letters Patent is hereby corrected as shown below:

Column 2,
Lines 32-52, should be replace with the following chemical structure:

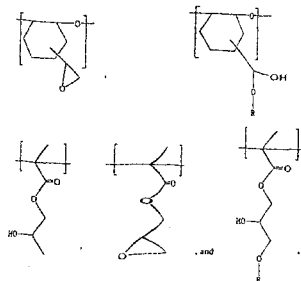

Column 4,
Lines 8-35, should be replaced with the following chemical structure:

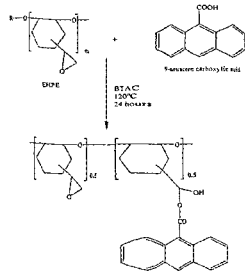

Columns 5 and 6,
Lines 5-45, should be replaced with the following chemical structure:

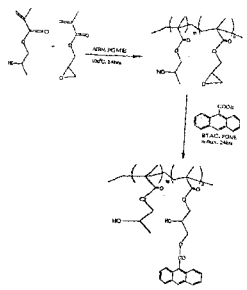

Column 6,
Lines 65-66, change "test samples utilizing an anti-reflective coating according to the invention." to read -- control samples. --

UNITED STATES PATENT AND TRADEMARK OFFICE
CERTIFICATE OF CORRECTION

PATENT NO. : 6,670,425 B2
DATED : December 30, 2004
INVENTOR(S) : Puligadda et al.

It is certified that error appears in the above-identified patent and that said Letters Patent is hereby corrected as shown below:

Column 7,
Line 2, change "control sample." to read -- test samples utilizing an anti-reflective coating according to the invention. --
Line 6, change "FIG. 1" to read -- FIG. 2. --
Line 7, change "FIG. 2" to read -- FIG. 1. --

Column 8,
Lines 5-25, should be replaced with the following chemical structure:

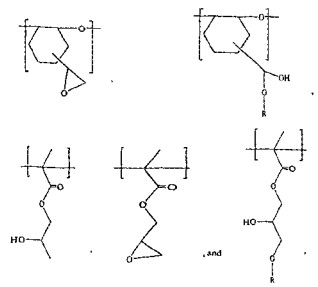

This certificate supersedes Certificate of Correction issued August 24, 2004.

Signed and Sealed this

Twenty-ninth Day of March, 2005

JON W. DUDAS
*Director of the United States Patent and Trademark Office*